United States Patent
Lewinnek et al.

(10) Patent No.: US 8,736,288 B2
(45) Date of Patent: May 27, 2014

(54) LIQUID COOLING DURING TESTING

(75) Inventors: David Walter Lewinnek, Somerville, MA (US); Ray Mirkhani, Porter Ranch, CA (US); Jack Michael Thompson, Camarillo, CA (US); John Kenji Narasaki, Camarillo, CA (US)

(73) Assignee: Teradyne, Inc., North Reading, MA (US)

( * ) Notice: Subject to any disclaimer, the term of this patent is extended or adjusted under 35 U.S.C. 154(b) by 346 days.

(21) Appl. No.: 13/108,090

(22) Filed: May 16, 2011

(65) Prior Publication Data

US 2012/0291999 A1 Nov. 22, 2012

(51) Int. Cl.
*G01R 31/10* (2006.01)

(52) U.S. Cl.
USPC ............................. 324/750.03; 324/750.08

(58) Field of Classification Search
None
See application file for complete search history.

(56) References Cited

U.S. PATENT DOCUMENTS

| | | | |
|---|---|---|---|
| 6,551,122 B2 | 4/2003 | Bosy et al. | |
| 6,828,774 B2 | 12/2004 | Bosy et al. | |
| 6,864,698 B2 | 3/2005 | Mirkhani et al. | |
| 6,911,836 B2 * | 6/2005 | Cannon et al. | 324/750.08 |
| 7,135,854 B2 | 11/2006 | Brian et al. | |
| 7,554,323 B2 | 6/2009 | Pfahnl et al. | |
| 7,598,725 B2 | 10/2009 | Bosy et al. | |
| 7,868,633 B1 * | 1/2011 | Chen | 324/750.3 |
| 2002/0106927 A1 | 8/2002 | Bosy et al. | |
| 2003/0077932 A1 | 4/2003 | Lewinnek | |
| 2003/0160604 A1 | 8/2003 | Bosy et al. | |
| 2004/0189280 A1 * | 9/2004 | Mirkhani et al. | 324/158.1 |
| 2005/0127897 A1 | 6/2005 | Bosy et al. | |
| 2007/0152695 A1 | 7/2007 | Bosy et al. | |
| 2008/0041568 A1 | 2/2008 | Pfahnl et al. | |

FOREIGN PATENT DOCUMENTS

| | | |
|---|---|---|
| JP | 05-315488 | 11/1993 |
| JP | 08-172286 | 7/1996 |
| JP | 10-186002 | 7/1998 |

OTHER PUBLICATIONS

Authorized officer Sung Hoon Kim, International Search Report and Written Opinion mailed Dec. 20, 2012 issued in international application No. PCT/US2012/037928, 12 pgs.
Machine translation generated Jan. 30, 2013 for JP-08-172286, 13 pgs.
Machine translation generated Jan. 30, 2013 for JP-10-186002, 19 pgs.
Machine translation generated Jan. 30, 2013 for JP-05-315488, 9 pgs.
International Preliminary Report on Patentability dated Nov. 28, 2103 issued in international application No. PCT/US2012/037928, 9 pgs.

* cited by examiner

*Primary Examiner* — Minh N Tang
(74) *Attorney, Agent, or Firm* — Fish & Richardson P.C.

(57) ABSTRACT

A system includes electronics for testing a device, a reservoir to store coolant, where the reservoir includes a bellows that is compressible, a pump system to move coolant out of the reservoir to cool the electronics, and means to compress the bellows and thereby pressurize the coolant stored in the reservoir so that the coolant remains substantially flush with an interface to the pump system.

31 Claims, 8 Drawing Sheets

LIQUID COOLING DURING TESTING

TECHNICAL FIELD

This patent application relates generally to liquid cooling during testing.

BACKGROUND

A test head includes electronics for testing a device. The electronics are often cooled in order to reduce undue heating. Cooling may be performed using liquid coolant, such as hydrofluoroether (HFE). Liquid cooling is typically performed using an external stationary assembly, which may include a reservoir, a heat exchanger, and a pump. This assembly is typically connected to the test head via flexible hoses, and does not move along with the test head. Often, the assembly is located on the floor of the testing facility.

SUMMARY

This patent application describes methods and apparatus for performing liquid cooling during testing, e.g., to liquid-cool rotatable test heads used during testing.

This patent application describes an apparatus for testing a device. The apparatus may include the following: a structure that is rotatable during testing, and electronics, connected to the structure, for use in testing the device. The structure may include a cooling system for cooling the electronics using liquid. The cooling system may include a reservoir for storing the liquid, and a pump system including an interface to the reservoir for transferring liquid out of the reservoir to cool the electronics. Mechanics may pressurize the liquid in the reservoir. The apparatus may include any appropriate features described in this patent application, examples of which are as follows.

The liquid may remain substantially flush with the interface during rotation of the structure. The reservoir may be compressible, and the mechanics may include a spring that is arranged to push against the reservoir to compress the reservoir. The mechanics may include multiple springs arranged to push against the reservoir to compress the reservoir. The mechanics may include an enclosure that substantially surrounds the reservoir, which enclosure may include an inlet to receive gas so that an interior of the enclosure is pressurized at least to a point where the reservoir compresses. The mechanics may include a piston to move within the reservoir. The mechanics may include a sealing ring around at least part of the piston and between the piston and an inner wall of the reservoir. The sealing ring may be made of rubber.

The pump system may include only one pump or multiple pumps. Multiple pumps may be connected in series between the reservoir and the electronics. The cooling system may include a heat exchanger for removing heat from the liquid.

This patent application also describes an apparatus that may include the following: electronics for testing a device, a reservoir to store coolant and that includes a bellows that is compressible, a pump system to move coolant out of the reservoir to cool the electronics, and means (e.g., a spring, piston, etc.) to compress the bellows and thereby pressurize the coolant stored in the reservoir so that the coolant remains substantially flush with an interface to the pump system. The apparatus may include any appropriate features described in this patent application, examples of which are as follows.

The spring may be a first spring and the apparatus may include a second spring and first and second mounts on which the first and second springs are held. The first and second mounts each may include a head. The first spring may be on the first mount between a head of the first mount and the bellows, and the second spring may be on the second mount between a head of the second mount and the bellows.

The apparatus may include a structure that is rotatable. The electronics, the reservoir, the pump system, and the spring may be contained within the structure to rotate during testing of the device.

This patent application also describes an apparatus that may include the following: electronics for testing a device, a reservoir to store coolant and that includes a bellows that is compressible, a pump system to move coolant out of the reservoir to cool the electronics, and an enclosure that substantially surrounds the pump system. The enclosure includes an opening to receive gas so that an interior of the enclosure is pressurized at least to a point where the bellows compresses. Compression of the bellows pressurizes the coolant stored in the reservoir so that the coolant remains substantially flush with an interface to the pump system. The apparatus may include any appropriate features described in this patent application, examples of which are as follows.

The enclosure may form a chamber that is substantially gas-tight. The apparatus may include a structure that is rotatable. The electronics, the reservoir, the pump system, and the enclosure are connected to the structure to rotate during testing of the device.

This patent application also describes an apparatus that may include the following: electronics for testing a device, a reservoir to store coolant, a pump system to move coolant out of the reservoir to cool the electronics, and a piston to move within the reservoir to pressurize the coolant in the reservoir so that the coolant in the reservoir remains substantially flush with an interface to the pump system. The apparatus may also include a structure that is rotatable, where the electronics, the reservoir, and the pump system are connected to the structure to rotate during testing of the device.

This patent application also describes an apparatus that may include the following: a structure that is rotatable during testing, and electronics, connected to the structure, for use in testing the device. The structure may include a cooling system, connected to the structure, for cooling the electronics using liquid. The cooling system may include a reservoir for storing the liquid, and a pump system including an interface to the reservoir for transferring liquid out of the reservoir to cool the electronics. Pressurizing means may pressurize the liquid in the reservoir.

Any two or more of the features described in this patent application, including this summary section, may be combined to form embodiments not specifically described in this patent application.

Parts of the foregoing may be implemented as a computer program product comprised of instructions that are stored on one or more non-transitory machine-readable storage media, and that are executable on one or more processing devices. All or part of the foregoing may be implemented as an apparatus, method, or system that may include one or more processing devices and memory to store executable instructions to implement functionality.

The details of one or more examples are set forth in the accompanying drawings and the description below. Further features, aspects, and advantages will become apparent from the description, the drawings, and the claims.

DETAILED DESCRIPTION

Figure 1:
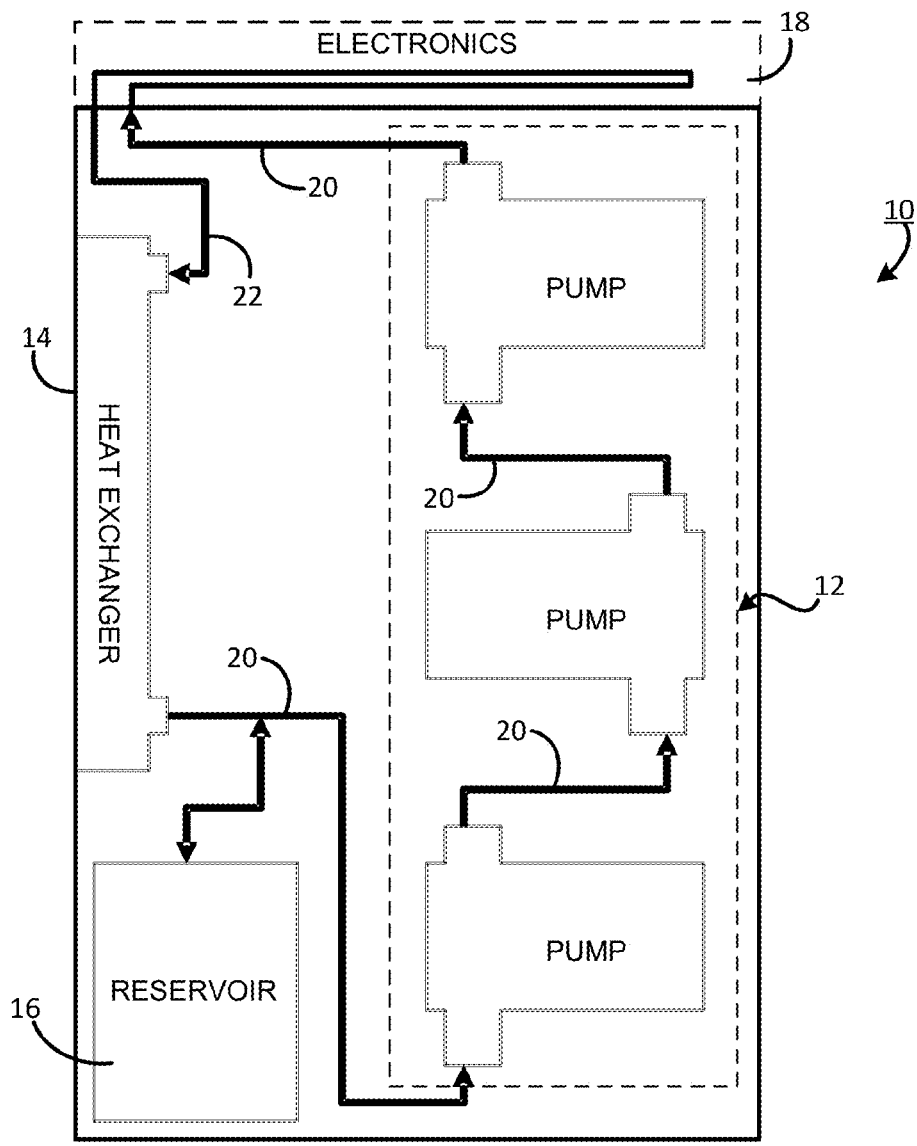
FIG. 1 is diagram of a cooling system for a test head.

Semiconductor manufacturers generally test semiconductor devices at various stages of production. During manufacturing, integrated circuits are fabricated in large quantities on a single silicon wafer. The wafer is cut into individual integrated circuits called dies. Each die is loaded into a frame, and bonding wires are attached to connect the die to leads that extend from the frame. The loaded frame is then encapsulated in plastic or another packaging material to produce a finished product.

Manufacturers have an economic incentive to detect and discard faulty components as early as possible in the manufacturing process. Accordingly, many semiconductor manufacturers test integrated circuits at the wafer level, before a wafer is cut into dies. Defective circuits are marked and generally discarded prior to packaging, thus saving the cost of packaging defective dies. As a final check, many manufacturers test each finished product before it is shipped.

To test quantities of semiconductor components, manufacturers commonly use automatic test equipment ("ATE" or "testers"). In response to instructions in a test program, a tester automatically generates input signals to be applied to an integrated circuit, and monitors output signals. The tester compares the output signals with expected responses to determine whether the device under test, or "DUT," is defective.

Customarily, component testers are designed in two different portions. A first portion, called a "test head" includes circuitry that may be located close to the DUT, for example, driving circuitry, receiving circuitry, and other circuitry for which short electrical paths are beneficial. A second portion, called a "tester body," is connected to the test head via cables, and contains electronics that may not be close to the DUT.

Special machines move and electrically connect devices to a tester in succession. A "prober" is used to move devices at the semiconductor wafer level. A "handler" is used to move devices at the packaged device level. Probers, handlers, and other devices for positioning a DUT relative to a tester are generically known as "peripherals." Peripherals generally include a site where DUTs are positioned for testing. The peripheral feeds a DUT to the test site, the tester tests the DUT, and the peripheral moves the DUT away from the test site, so that another DUT can be tested.

The test head and peripheral are separate pieces of machinery that generally have separate support structures. Therefore, before testing begins, the test head and the peripheral are attached together. In general, this is accomplished by moving the test head toward the peripheral, aligning the test head, and latching the test head to the peripheral. Once latched, a docking mechanism pulls the test head and peripheral together, causing spring-loaded contacts between the test head and peripheral to compress and form electrical connections between the tester and the DUT.

Heat may be generated in the test head during testing. A cooling system may be used to cool the electronics contained therein, and thereby reduce the possibility that those electronics will become overheated. One method uses liquid coolant to cool the test head.

In this regard, described herein is an apparatus (e.g., a test head) for testing a device. The apparatus includes a structure that is rotatable during testing, and electronics, connected to the structure, for use in testing the device. A cooling system is also connected to the structure for cooling the electronics using liquid. The cooling system includes a reservoir for storing the liquid and a pump system that includes an interface to the reservoir for transferring liquid out of the reservoir to cool the electronics. The liquid in the reservoir is pressurized so that the liquid remains substantially flush with the interface during rotation of the structure regardless of the orientation of the test head. As described below, the liquid may be pressurized using mechanics, such as a spring or piston, or other structures, such as a collapsible bag that holds the liquid during rotation.

In an implementation, the test head includes a cooling system that is inside, rather than outside, the test head. FIG. 1 shows an example of such a test head cooling system 10. Test head cooling system 10 includes a pump system 12, a heat exchanger 14, and a reservoir 16 for storing liquid coolant such as HFE. In this example, reservoir 16 is a compressible bellows. However, cooling system 10 is not limited to this type of reservoir, as described in more detail below. Also, in this example, pump system 12 includes three pumps that are connected in series between reservoir 16 and electronics 18. However, pump system 12 is not limited to three pumps connected in this manner, and may include one pump or more than one pump connected in any appropriate series and/or parallel configuration.

In operation, reservoir 16 stores the liquid coolant. Pump system 12 transfers liquid coolant out of reservoir 16, and pumps the liquid coolant through paths 20, such as pipes or hoses, to cool electronics 18. The coolant then returns, along similar paths 20, to heat exchanger 14. At this point, coolant in path 22 is warmer than coolant in reservoir 16. The coolant therefore passes through heat exchanger 14, which reduces the temperature of the coolant. Thereafter, the reduced-temperature coolant passes either into reservoir 16 or back through pump system 12, in this closed-loop system. The foregoing process then repeats in order to maintain the electronics within a predefined temperature range. In an example, the temperature of the electronics may be measured by a monitoring device or the like (not shown), and reported to a processing device that controls operation of the cooling system (e.g., the pump system) to regulate the temperature of electronics 18.

Figure 2:
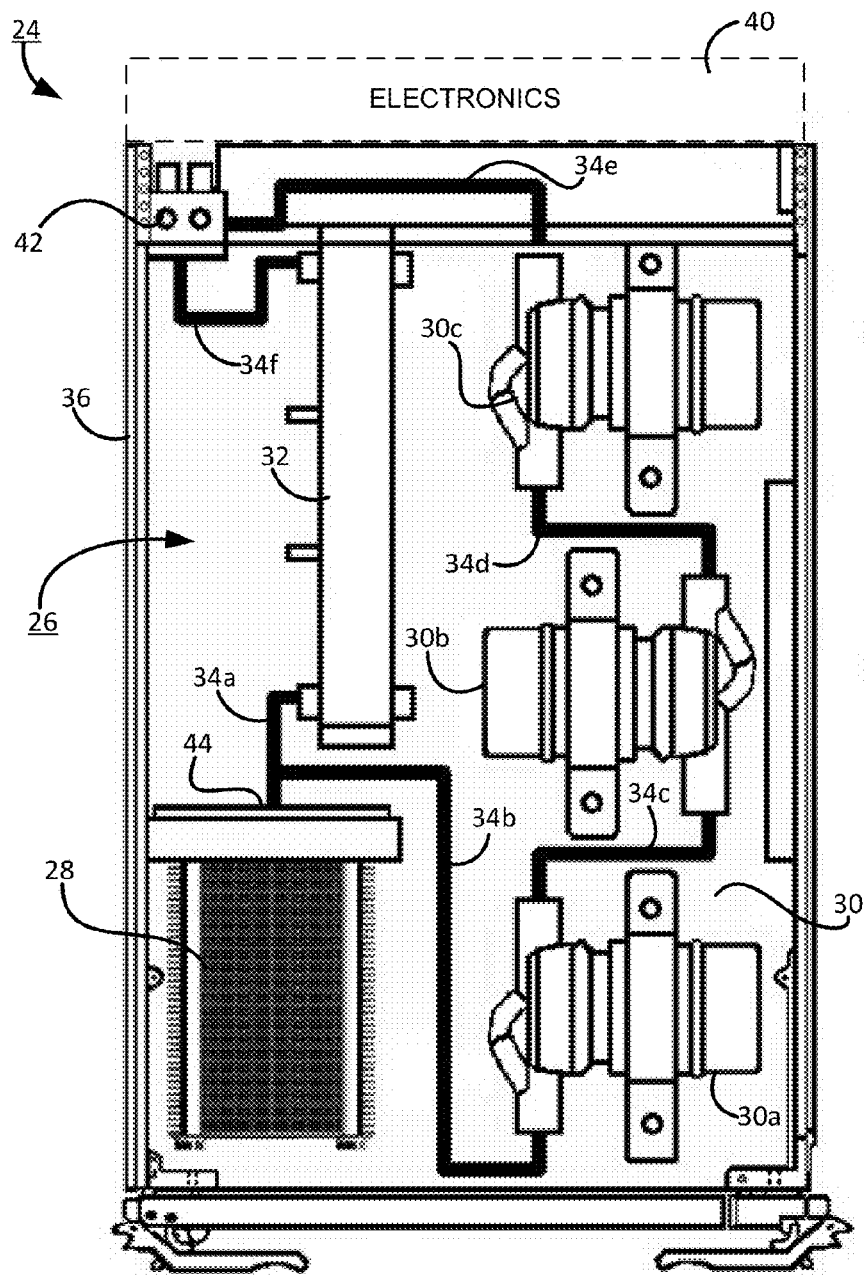
FIG. 2 is a side view of an implementation of the cooling system of FIG. 1.
Figure 3:
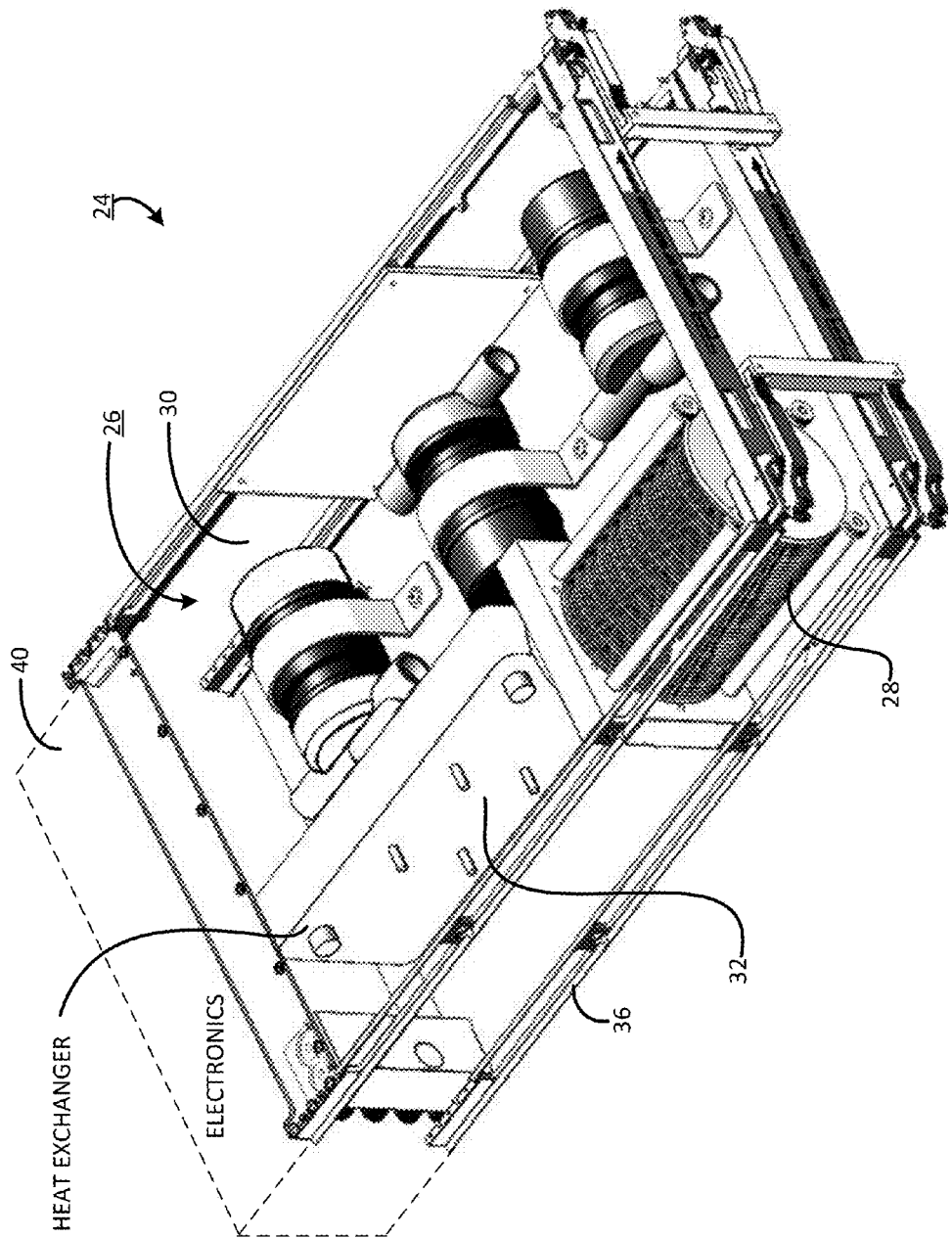
FIG. 3 is a perspective view of an implementation of the cooling system of FIG. 2.

FIGS. 2 and 3 show side and perspective views, respectively, of a test head 24. In this implementation, test head 24 includes cooling system 26 that is similar to, or identical to, the cooling system shown in FIG. 1. That is, cooling system 26 includes a reservoir 28, a pump system 30, a heat exchanger 32, and paths 34a to 34f (FIG. 2), through which liquid coolant passes. The components of cooling system 26 are mounted to the structure of test head 26, which includes frame 36 in this example. Electronics 40 for testing a DUT are also mounted to frame 36. As shown in FIGS. 2 and 3, mounting may be performed via brackets, screws, or other fixing materials. The paths that pass coolant may include metal pipes, plastic hoses, tubes, or combinations of two or more such materials. These components may be connected in the manner shown in FIGS. 2 and 3, or any other appropriate manner.

Pump system 30 includes three pumps connected in series between reservoir 28 and electronics 40. In this example, pumps 30a, 30b and 30c move liquid coolant from reservoir 28, via paths 34a, 34b, 34c, 34d, and 34e, to a coolant distribution unit (CDU) 42. CDU 42 passes that coolant through electronics 40 via hoses, tubes or the like (not shown), and returns "used" coolant to heat exchanger 32 via path 34f. It is noted that pump system 30 is not limited to three pumps connected in the configuration shown in FIGS. 2 and 3, and may include one pump or more than one pump connected in any appropriate series and/or parallel configuration. An example pump that may be used for each of the three pumps in the system of FIGS. 2 and 3 is a Laing SM-1212-BS-26 pump. An example heat exchanger that may be used in the cooling system is a GEA FG5×12-16 heat exchanger.

As was also the case in FIG. 1, in this example, reservoir 28 is a compressible bellows. The bellows may be made of stainless steel, and may compress, in response to external pressure, from a volume of about one gallon to a volume of about half a gallon. An example of such a bellows is a MetalFlex bellows P/N 52535×50. Compressing the bellows pressurizes the liquid coolant contained in the bellows. Under enough pressure (e.g., the pressure on the bellows is higher than the vapor pressure of the liquid coolant in the reservoir), the liquid coolant remains substantially flush with the pump system's interface 44 to the reservoir regardless of the orientation of the test head (e.g., during rotation). As shown, this interface may include tubes, hoses, etc. connected to reservoir 28. By maintaining the liquid coolant substantially flush with interface 44, the chances that that pump system 30 will pump vapor from the liquid coolant into the paths is reduced. As is generally known, gas bubbles in a liquid cooling system can cause seals (e.g., pump seals) to degrade, which can eventually lead to coolant leaks in the system. As such, it is beneficial to reduce the amount of gas bubbles in liquid coolant.

Test head 24 rotates during testing. If the liquid coolant were not under pressure, the liquid coolant within the reservoir would move or slosh in response to this rotation. By applying sufficient pressure to the liquid coolant, the liquid coolant can remain substantially flush with the pump system's interface 44 to reservoir 28 during rotation of the test head and regardless of the orientation of the test head. The pressure applied can also prevent boiling of the liquid coolant, and can address problems associated with changes in coolant volume resulting from thermal expansion and contraction. In an example the amount of pressure applied to the liquid coolant is two to three pounds-per-square inch (PSI); however, the systems described herein are not limited to applying pressures in that range.

Figure 4:
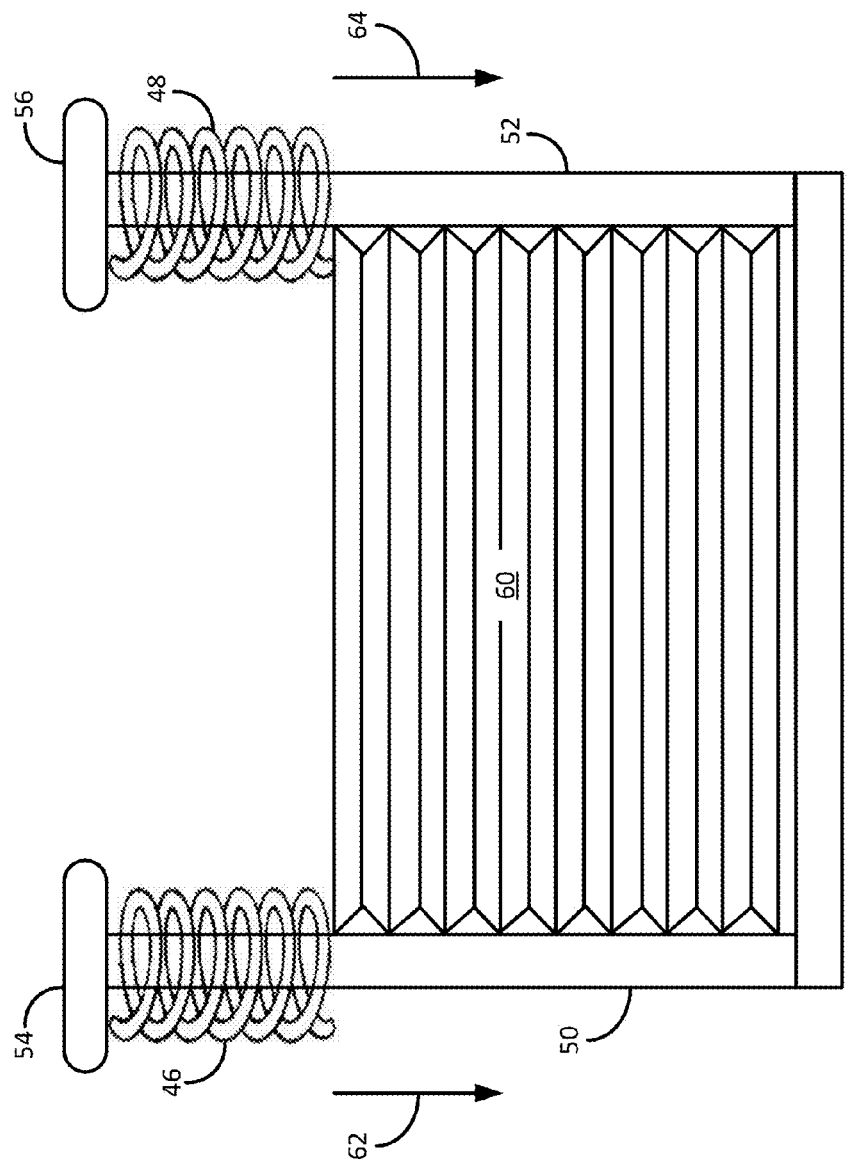
FIG. 4 is a front view of a reservoir of a test head cooling system implemented as a bellows, the compression of which is controlled via a spring system.

In an example, the pressure applied to the bellows may be applied using mechanics, such as the one or more springs shown in FIG. 4. In this regard, FIG. 4 shows two springs 46, 48 held on respective mounts 50, 52 between mount heads 54, 56 and bellows 60 (which is an implementation of reservoir 28). In this configuration, the springs apply pressure along vectors 62, 64 to thereby compress bellows 60. The amount of compression is limited by the amount of liquid coolant contained within bellows 60. As the amount of liquid in bellows 60 decreases (e.g., due to leaks, evaporation or the like), springs 46, 48 further compress bellows 60 to meet the volume of the liquid.

In the example of FIG. 4, two springs and two mounts are shown. However, any number of springs and mounts may be used. Furthermore, in the example of FIG. 4, the springs are shown without casings. In other examples, the springs may be encased to form plungers or the like. In still other examples, the springs of FIG. 4 may be replaced with electronically controlled pistons (not shown) that regulate the amount of applied compression based on the amount of liquid coolant in the bellows. For example, a sensor (not shown) may be configured to sense the amount of liquid in bellows 60, and to send a signal to a controller (not shown) that controls the pistons to apply the appropriate amount of pressure to the bellows for the amount of liquid in the bellows.

Figure 5:
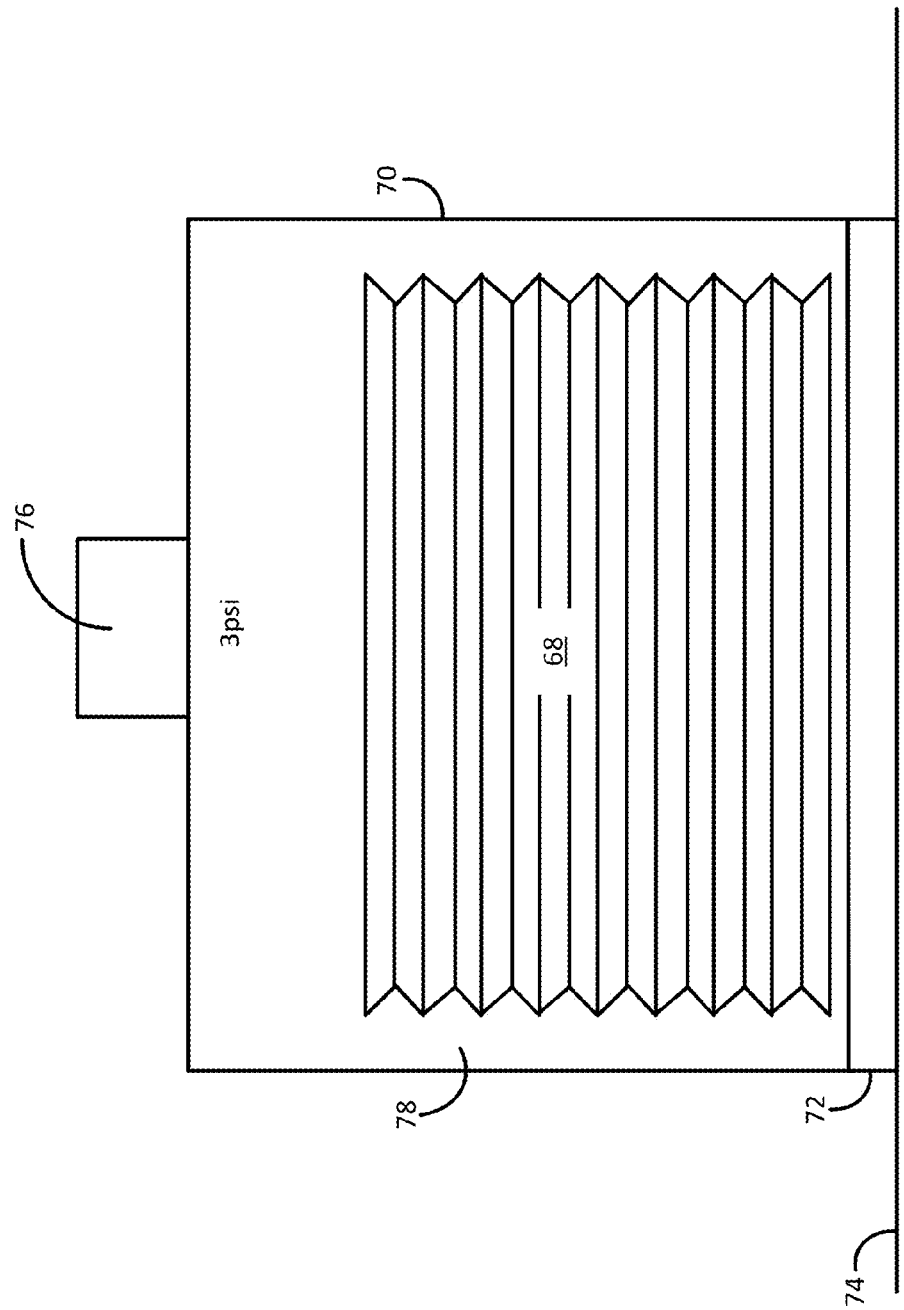
FIG. 5 is a front view of a reservoir of a test head cooling system implemented as a bellows, the compression of which is controlled via air pressure.

In another example, which is shown in FIG. 5, the mechanics used to compress the bellows 68 (which is an implementation of reservoir 28), and thereby pressurize the liquid coolant, includes an enclosure 70, which substantially encloses bellows 68. Enclosure 70 may provide a gas-tight seal over bellows 68, although a complete gas-tight seal is not necessary. To this end, a gasket or the like 72 may be between enclosure 70 and a flat mounting area 74 for bellows 68. Enclosure 70 includes inlet 76 to receive gas so that an interior of the enclosure is pressurized at least to a point where bellows 68 compresses. To this end, the cooling system may include a gas pump (not shown) and a hose (not shown) to pump gas (e.g., air) into enclosure 70 via inlet 76. The gas pump and hose may be internal to, and connected to, the test head. The resulting increase in gas pressure causes bellows 68 to compress. The amount of gas pressure may be controlled so that the pressure on the liquid is a constant two or three PSI. For example, a monitor within enclosure 70 may monitor the gas pressure within the resulting chamber 78 created by enclosure 70. The monitor may provide the gas pressure reading to a controller (not shown), which controls the gas pump to either increase or decrease the amount of gas pressure in the chamber. Instead of monitoring the gas pressure, a regulator could also be used. In this regard, a regulator is a mechanical pressure sensitive valve that lets air in if the pressure decreases below a threshold, and lets air out if pressure increases above another threshold.

Alternatively, the amount of compression may be commensurate with the amount of liquid stored in bellows 68. For example, a monitor may detect the amount of liquid in bellows 68. In response, the controller may control the gas pump to increase (or decrease) the amount of pressure in the chamber based on the amount of liquid in the bellows. For example, as the amount of liquid in the bellows decreases, the amount of pressure in the chamber may be controlled to increase. As a result, the bellows further compresses, thereby maintaining the liquid contained therein under pressure that is constant or variable.

Figure 6:
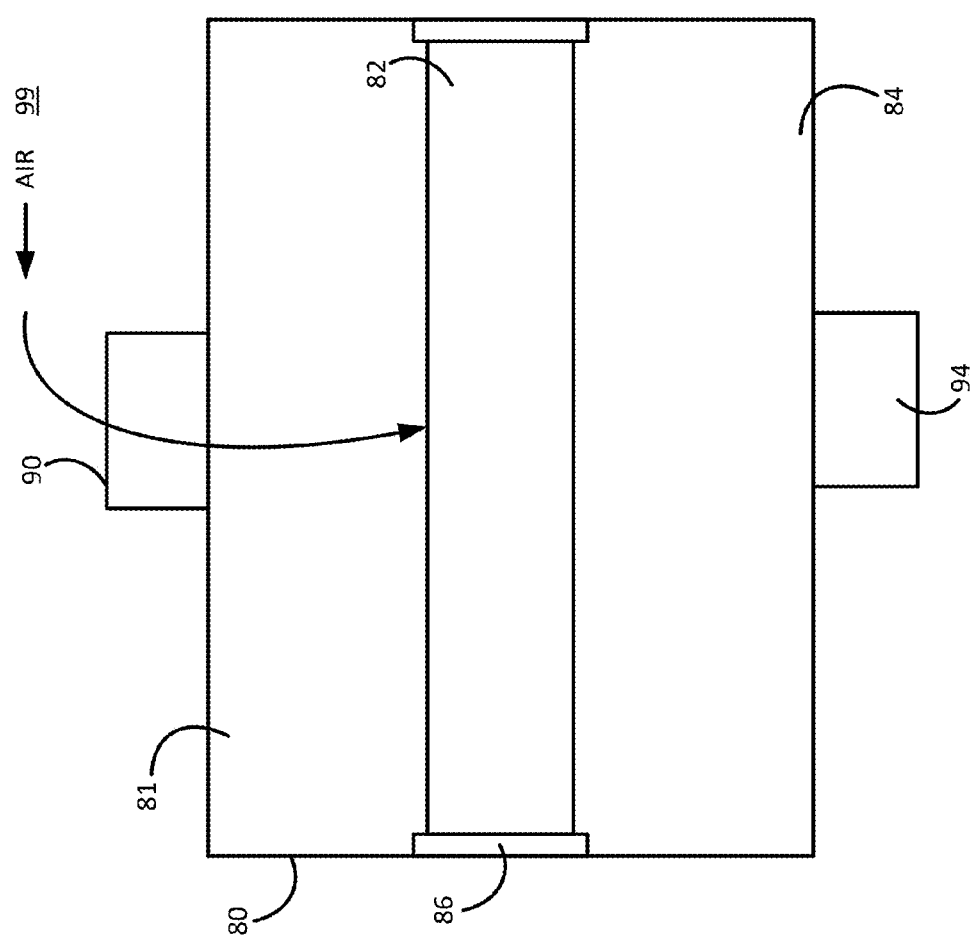
FIG. 6 is a front view of a reservoir of a test head cooling system implemented as a tank having an internal piston to control the pressure of liquid coolant stored therein.

In another implementation, the reservoir may be a tank 80 that is not compressible, as shown in FIG. 6. In this example, a piston 82 is configured to move within tank 80 to pressurize the liquid coolant 84 in the tank. A sealing ring 86 may be arranged around at least part of the piston and between the piston and an inner wall of the tank. Sealing ring 86 creates a liquid/gas-tight seal with the inner wall of the tank. Piston 82 may be controlled by pumping gas (e.g., air) into chamber 88 through an inlet 90. A gas pump (not shown) may be used to pump the gas. The amount of gas introduced into chamber 88 controls the pressure applied to piston 82. In an example, the amount of gas added to chamber 88 may control piston 82 so that it produces a relatively constant pressure of two to three PSI on liquid coolant 84. As a result of this pressure created by piston 82, liquid coolant 84 in the reservoir remains substantially flush with an interface 94 to the pump system regardless of the orientation of the test head.

Figure 7:
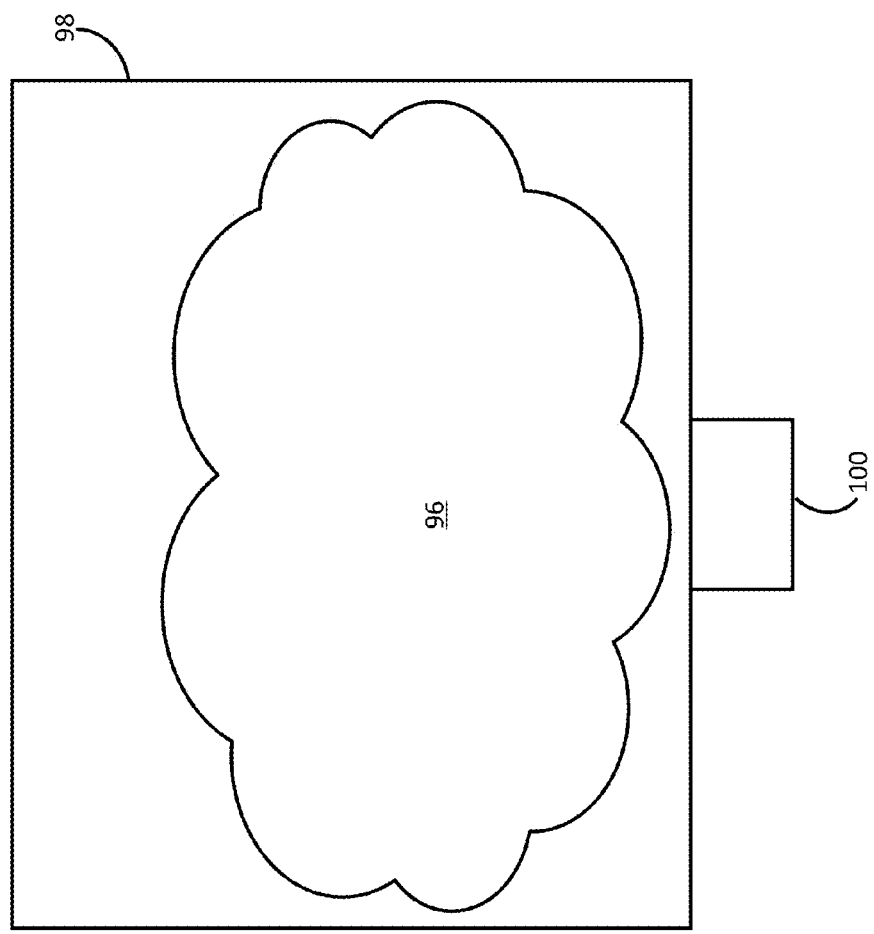
FIG. 7 is a front view of a reservoir of a test head cooling system implemented as a collapsible bladder inside of a tank.

Rather than using mechanics to control the liquid coolant, a collapsible bag or bladder inside a tank may be used to ensure that liquid coolant contained therein remains substantially flush with the pump system's interface to the reservoir regardless of the orientation of the test head. For example, FIG. 7 shows a bladder 96 in a tank 98 (which together constitute an implementation of reservoir 28). The bladder may be made of a material that does not corrode in the presence of coolant. As the coolant in the bladder decreases, the bladder contracts, keeping the coolant substantially flush with an interface 100 to the pump system regardless of the orientation of the test head. This may be achieved by vacuum-storing the coolant in the bladder.

Figure 8:
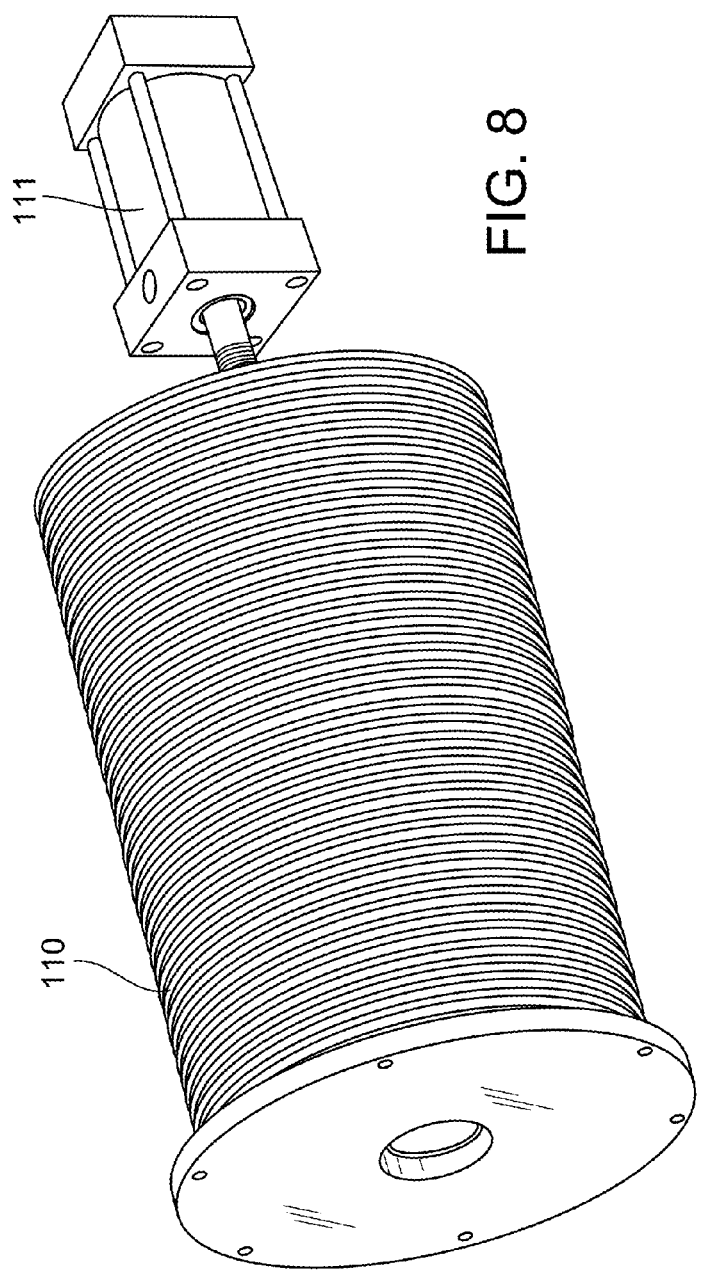
FIG. 8 shows an example of a bellows controlled by an air cylinder, which applies pressure to compress the bellows.

In another example, FIG. 8 shows an example of a bellows 110 controlled by an air cylinder 111, which applies pressure to compress the bellows. The air cylinder may be controlled electronically, e.g., via a computer.

An example of a type of HFE that may be used in the implementations described herein includes Novec™ 7100 from 3M™. In addition to HFE, other possible liquid coolants include, but are not limited to, water, ethylene glycol, and DOWTHERM™ synthetic organic fluids.

The pressures mentioned above include two to three PSI at 20° C.±1° C. However, the cooling systems described herein are not limited to pressurizing liquid coolant at these pressures and temperatures. Any appropriate pressures may be achieved at any appropriate temperatures. Furthermore, constant or variable pressures may be used. For example, the pressure applied may be controlled to be higher when the liquid coolant is oriented in such a way that it naturally flows away from the pump interface.

The cooling system described herein is closed loop in that it outputs liquid coolant to electronics, passes the liquid coolant through a heat exchanger, and passes the liquid coolant back to a reservoir and/or back to the electronics. The cooling system, however, need not be closed loop. Rather, new coolant may be fed into the reservoir, as needed, from an external source. In this example, recycled coolant need not be used to supplement the reservoir.

Among the advantages of the test head configuration described herein is that the test head has a "zero footprint". What this means colloquially is that the cooling system does not take up space on the test floor (since the cooling system is embedded in, e.g., contained within, the test head). As also explained above, the cooling system described herein reduces gas bubbles in the coolant.

The control features described herein (e.g., control of the test head, air flow, piston compression, and the like) can be implemented, at least in part, via a computer program product, i.e., a computer program tangibly embodied in one or more information carriers, e.g., in one or more tangible, non-transitory machine-readable storage media, for execution by, or to control the operation of, data processing apparatus, e.g., a programmable processor, a computer, or multiple computers A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing the control features can be performed by one or more programmable processors executing one or more computer programs to perform the functions of the calibration process. All or part of the processes can be implemented as, special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Elements of different embodiments described herein may be combined to form other embodiments not specifically set forth above. Elements may be left out of the structures described herein without adversely affecting their operation. Furthermore, various separate elements may be combined into one or more individual elements to perform the functions described herein.

Elements of different implementations described herein may be combined to form other implementations not specifically set forth above. Other implementations not specifically described herein are also within the scope of the following claims.

What is claimed is:

1. An apparatus for testing a device, the apparatus comprising:
   a structure that is rotatable during testing;
   electronics, connected to the structure, for use in testing the device;
   the structure comprising:
      a cooling system, connected to the structure, for cooling the electronics using liquid, the cooling system comprising:
         a reservoir for storing the liquid; and
         a pump system comprising an interface to the reservoir for transferring liquid out of the reservoir to cool the electronics;
         wherein the liquid is pressurized to remain at the interface during rotation.

2. The apparatus of claim 1, further comprising:
   mechanics to pressurize the liquid in the reservoir.

3. The apparatus of claim 1, wherein the liquid remains substantially flush with the interface during rotation of the structure.

4. The apparatus of claim 1, wherein the reservoir is compressible; and
   wherein the mechanics comprises a spring that is arranged to push against the reservoir to compress the reservoir.

5. The apparatus of claim 4, wherein the mechanics comprise multiple springs arranged to push against the reservoir to compress the reservoir.

6. The apparatus of claim 1, wherein the reservoir is compressible; and
   wherein the mechanics comprises an enclosure that substantially surrounds the reservoir, the enclosure comprising an inlet to receive gas so that an interior of the enclosure is pressurized at least to a point where the reservoir compresses.

7. The apparatus of claim 1, wherein the mechanics comprises a piston to move within the reservoir.

8. The apparatus of claim 7, wherein the mechanics further comprise a sealing ring around at least part of the piston and between the piston and an inner wall of the reservoir.

9. The apparatus of claim 8, wherein the sealing ring comprises rubber.

10. The apparatus of claim 1, wherein the pump system comprises only one pump.

11. The apparatus of claim 1, wherein the pump system comprises multiple pumps.

12. The apparatus of claim 11, wherein the multiple pumps are connected in series between the reservoir and the electronics.

13. The apparatus of claim 1, wherein the cooling system further comprises:
a heat exchanger for removing heat from the liquid.

14. The apparatus of claim 1, wherein
the reservoir comprises a bellows that is compressible and the liquid comprises coolant; and
wherein the apparatus further comprises a spring to compress the bellows and thereby pressurize the coolant stored in the reservoir so that the coolant remains substantially flush with an interface to the pump system.

15. The apparatus of claim 14, wherein the spring is a first spring and the apparatus further comprises a second spring and first and second mounts on which the first and second springs are held, the first and second mounts each comprising a head; and
wherein the first spring is on the first mount between a head of the first mount and the bellows, and the second spring is on the second mount between a head of the second mount and the bellows.

16. The apparatus of claim 14, wherein the electronics, the reservoir, the pump system, and the spring are contained within the structure to rotate during testing of the device.

17. The apparatus of claim 1, wherein
the reservoir comprises a bellows that is compressible and the liquid comprises coolant; and
wherein the apparatus further comprises an enclosure that substantially surrounds the pump system, the enclosure comprising an opening to receive gas so that an interior of the enclosure is pressurized at least to a point where the bellows compresses;
wherein compression of the bellows pressurizes the coolant stored in the reservoir so that the coolant remains substantially flush with an interface to the pump system.

18. The apparatus of claim 17, wherein the enclosure forms a chamber that is substantially gas-tight.

19. The apparatus of claim 17, wherein the electronics, the reservoir, the pump system, and the enclosure are connected to the structure to rotate during testing of the device.

20. The apparatus of claim 1, wherein the liquid comprises coolant; and
wherein the apparatus further comprises a piston to move within the reservoir to pressurize the coolant in the reservoir so that the coolant in the reservoir remains substantially flush with an interface to the pump system.

21. The apparatus of claim 1, further comprising:
pressurizing means for pressurizing the liquid in the reservoir
wherein the reservoir comprises a bellows that is compressible and the liquid comprises coolant; and
wherein the pressurizing means comprises means to compress the bellows and thereby pressurize the coolant stored in the reservoir so that the coolant remains substantially flush with an interface to the pump system.

22. The apparatus of claim 1, wherein the reservoir comprises:
a tank; and
a bladder inside the tank for storing the liquid;
wherein the bladder is configured to keep the liquid substantially flush with the interface regardless of an orientation of the structure during rotation.

23. The apparatus of claim 22, wherein the liquid is vacuum stored in the bladder.

24. An apparatus for testing a device, the apparatus comprising:
a structure that is rotatable during testing;
electronics, connected to the structure, for use in testing the device;
the structure comprising:
a cooling system, connected to the structure, for cooling the electronics using liquid, the cooling system comprising:
a tank;
a bladder inside the tank for storing the liquid, the bladder and the tank together comprising a reservoir; an
a pump system comprising an interface to the reservoir for transferring liquid out of the reservoir to cool the electronics; and
wherein the bladder is configured to keep the liquid substantially flush with the interface regardless of an orientation of the structure during rotation.

25. The apparatus of claim 24, wherein the liquid is vacuum stored in the bladder.

26. The apparatus of claim 24, wherein the liquid comprises coolant and wherein the bladder comprises a material that the coolant does not degrade.

27. The apparatus of claim 24, wherein the bladder is configured to contract as liquid is extracted therefrom so that the liquid remains substantially flush with the interface regardless of an orientation of the structure during rotation.

28. The apparatus of claim 24, wherein the pump system comprises only one pump.

29. The apparatus of claim 24, wherein the pump system comprises multiple pumps.

30. The apparatus of claim 29, wherein the multiple pumps are connected in series between the reservoir and the electronics.

31. The apparatus of claim 24, wherein the cooling system further comprises:
a heat exchanger for removing heat from the liquid.

* * * * *